(12) United States Patent
Hattori et al.

(10) Patent No.: US 10,014,111 B2
(45) Date of Patent: Jul. 3, 2018

(54) SUBSTRATE TERMINAL MOUNTED ELECTRONIC ELEMENT

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/661,018

(22) Filed: Mar. 18, 2015

(65) Prior Publication Data

US 2015/0270068 A1    Sep. 24, 2015

(30) Foreign Application Priority Data

Mar. 24, 2014    (JP) .................................. 2014-059985

(51) Int. Cl.
*H01G 4/30* (2006.01)
*H01G 4/228* (2006.01)
(Continued)

(52) U.S. Cl.
CPC ................. *H01G 4/30* (2013.01); *H01C 1/14* (2013.01); *H01C 7/18* (2013.01); *H01F 27/292* (2013.01);
(Continued)

(58) Field of Classification Search
CPC ................................ H01G 4/30; H01G 4/232; H01G 4/12; H01G 4/012; H01G 4/1227; H01G 2/06; H01G 2/065
See application file for complete search history.

(56) References Cited

U.S. PATENT DOCUMENTS

2004/0066589 A1    4/2004   Togashi et al.
2008/0019081 A1*   1/2008   Kim .................. H01G 2/06
                                                    361/535
(Continued)

FOREIGN PATENT DOCUMENTS

JP          09148728 A  *  6/1997
JP        2004-134430 A    4/2004
(Continued)

OTHER PUBLICATIONS

Official Communication issued in corresponding Japanese Patent Application No. 2014-059985, dated Feb. 23, 2016.

*Primary Examiner* — David M Sinclair
(74) *Attorney, Agent, or Firm* — Keating & Bennett, LLP

(57) ABSTRACT

An electronic component includes an electronic element including external electrodes on a surface and a substrate terminal on which the electronic element is mounted. The substrate terminal includes a first main surface, a second main surface opposite the first main surface, and a peripheral surface joining the first main surface and the second main surface. The substrate terminal includes mounting electrodes provided on the second main surface and electrically connected to the external electrodes of the electronic element, and connection electrodes provided on the first main surface and electrically connected to lands of a circuit substrate. A maximum width of the connection electrodes is greater than a maximum width of the mounting electrodes.

18 Claims, 18 Drawing Sheets

(51) Int. Cl.
*H01C 1/14* (2006.01)
*H01C 7/18* (2006.01)
*H01G 2/06* (2006.01)
*H01G 4/12* (2006.01)
*H01G 4/232* (2006.01)
*H05K 1/14* (2006.01)
*H01F 27/29* (2006.01)
*H05K 1/18* (2006.01)
*H05K 1/11* (2006.01)
*H05K 3/00* (2006.01)

(52) U.S. Cl.
CPC ............ *H01G 2/065* (2013.01); *H01G 4/12* (2013.01); *H01G 4/228* (2013.01); *H01G 4/232* (2013.01); *H05K 1/141* (2013.01); *H05K 1/113* (2013.01); *H05K 1/181* (2013.01); *H05K 3/0097* (2013.01); *H05K 2201/049* (2013.01); *H05K 2201/09181* (2013.01)

(56) References Cited

U.S. PATENT DOCUMENTS

| | | | | |
|---|---|---|---|---|
| 2011/0102969 A1* | 5/2011 | Togashi | ................ | H01G 4/012 361/306.3 |
| 2013/0033836 A1* | 2/2013 | Hattori | ................... | H01G 4/30 361/768 |
| 2013/0037911 A1* | 2/2013 | Hattori | ................... | H01L 28/40 257/532 |
| 2013/0329389 A1 | 12/2013 | Hattori et al. | | |
| 2014/0041914 A1 | 2/2014 | Hattori et al. | | |
| 2014/0116768 A1* | 5/2014 | Hattori | ................... | H01G 2/065 174/260 |
| 2015/0122534 A1* | 5/2015 | Park | ..................... | H01G 2/065 174/260 |

FOREIGN PATENT DOCUMENTS

| | | |
|---|---|---|
| JP | 2004-335657 A | 11/2004 |
| JP | 2007-220827 A | 8/2007 |
| JP | 2012-204572 A | 10/2012 |
| JP | 2012-212943 A | 11/2012 |
| JP | 2012-212944 A | 11/2012 |
| JP | 2013-038144 A | 2/2013 |
| JP | 2013-038291 A | 2/2013 |
| JP | 2013-258240 A | 12/2013 |
| JP | 2014-057046 A | 3/2014 |
| JP | 5459444 B2 | 4/2014 |
| JP | 5459445 B2 | 4/2014 |
| WO | 2012/090986 A1 | 7/2012 |
| WO | WO 2013008549 A1 * | 1/2013 ............ H01G 2/065 |
| WO | 2013/153717 A1 | 10/2013 |

\* cited by examiner

SUBSTRATE TERMINAL MOUNTED ELECTRONIC ELEMENT

BACKGROUND OF THE INVENTION

1. Field of the Invention

The present invention relates to an electronic component, and particularly relates to an electronic component that includes an electronic element exhibiting electrostriction.

2. Description of the Related Art

Documents according to the related art disclosing an electronic component attempting to reduce the occurrence of noise by suppressing the transmission of vibrations include Japanese Unexamined Patent Application Publication No. 2004-134430. In the electronic component described in Japanese Unexamined Patent Application Publication No. 2004-134430, under a capacitor element serving as the main body of a multilayer capacitor, one interposer substrate defining a terminal, which is also referred herein to as a substrate terminal, is disposed. A pair of external electrodes of the capacitor element and a pair of mounting electrodes respectively connected thereto are disposed on a front surface side of the interposer substrate. A wiring pattern of the substrate and a pair of connection electrodes respectively connected thereto by solder are disposed on a back surface side of the interposer substrate.

When an electronic component is mounted on a circuit substrate by connecting an electronic element, for example, the capacitor element, to the circuit substrate with a substrate terminal sandwiched therebetween, burrs on electrodes of the substrate terminal may cause mounting defects to occur in the electronic component. When the electrodes are reduced in size so that the electrodes do not reach a circumferential surface of the substrate terminal in order to suppress the occurrence of burrs on the electrodes of the substrate terminal, then mounting stability of the electronic component is reduced.

SUMMARY OF THE INVENTION

Accordingly, preferred embodiments of the present invention provide an electronic component that is able to maintain mounting stability while preventing the occurrence of burrs on the electrodes of the substrate terminal.

According to a preferred embodiment of the present invention, an electronic component to be mounted on a circuit substrate including a land includes an electronic element including an external electrode on a surface thereof, and a substrate terminal on which the electronic element is mounted. The substrate terminal includes a first main surface, a second main surface that is opposite the first main surface, and a circumferential surface joining the first main surface and the second main surface. The substrate terminal includes a mounting electrode that is provided on the second main surface and that is electrically connected to the external electrode on the electronic element, and a connection electrode that is provided on the first main surface and that is electrically connected to the land on the circuit substrate. A maximum width of the connection electrode is greater than a maximum width of the mounting electrode.

According to a preferred embodiment of the present invention, the connection electrode includes a circumferential-surface neighboring portion positioned adjacent to the circumferential surface of the substrate terminal.

According to a preferred embodiment of the present invention, a portion of the circumferential-surface neighboring portion covers the circumferential surface of the substrate terminal.

According to a preferred embodiment of the present invention, the substrate terminal has an external shape that preferably is rectangular or substantially rectangular in a plan view. The circumferential surface of the substrate terminal includes a pair of side surfaces at mutually opposing positions, and a pair of end surfaces at mutually opposing positions that respectively join the side surfaces. In the present invention, the plan view indicates a view in a height direction perpendicular or substantially perpendicular to the first main surface of the substrate terminal.

According to a preferred embodiment of the present invention, with respect to a direction parallel or substantially parallel to a direction of joining the side surfaces along the end surfaces, a maximum width of the substrate terminal is less than a maximum width of the electronic element.

According to a preferred embodiment of the present invention, with respect to a direction parallel or substantially parallel to a direction of joining the end surfaces along the side surfaces, a maximum length of the substrate terminal is less than a maximum length of the electronic element.

According to a preferred embodiment of the present invention, the substrate terminal is entirely covered by the electronic element in a plan view.

According to a preferred embodiment of the present invention, the mounting electrode is separated or spaced from the end surfaces in a plan view.

According to the preferred embodiments of the present invention, the occurrence of burrs on the electrode of the substrate terminal is prevented while mounting stability of the electronic component is maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
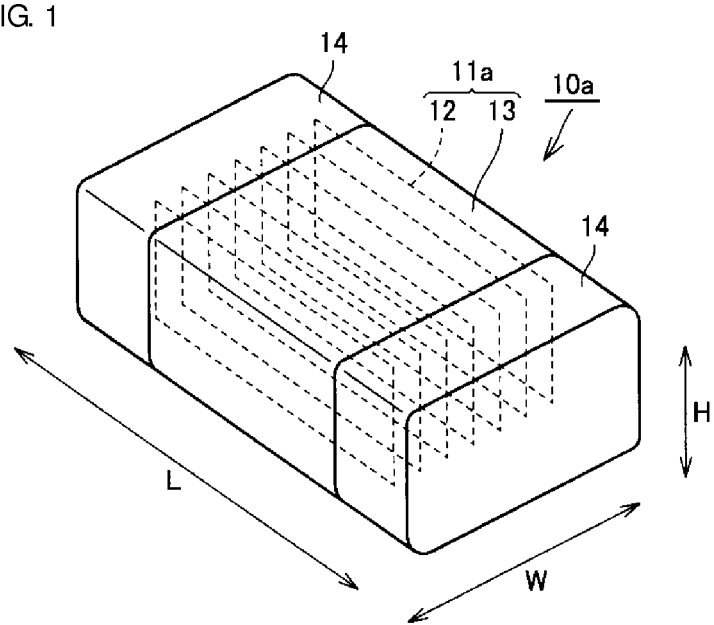
FIG. 1 is a perspective view illustrating a first configuration of a capacitor element included in an electronic component according to a preferred embodiment of the present invention.

An electronic component according to preferred embodiments of the present invention is described below, with reference to the accompanying drawings. In the following description of the preferred embodiments, identical and corresponding elements in the drawings use identical reference signs, and explanations thereof are not repeated.

First, a capacitor element is described as an example of an electronic element in the electronic component according to a preferred embodiment of the present invention. However, the electronic element is not limited to a capacitor element. An inductor element, a thermistor element, a piezoelectric element, a semiconductor element, and the like may also be provided according to various preferred embodiments of the present invention.

Figure 2:
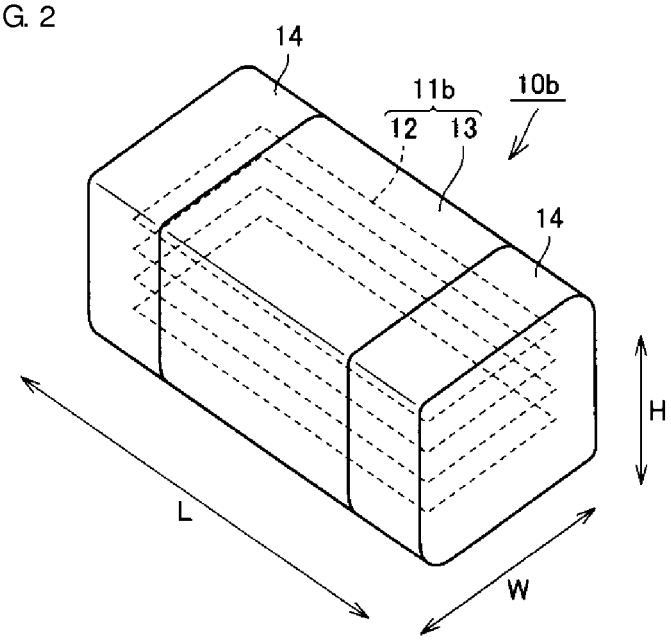
FIG. 2 is a perspective view illustrating a second configuration of the capacitor element included in the electronic component according to a preferred embodiment of the present invention.

FIG. 1 is a perspective view illustrating a first configuration of the capacitor element included in the electronic component according to a preferred embodiment of the present invention. FIG. 2 is a perspective view illustrating a second configuration of the capacitor element included in the electronic component according to a preferred embodiment of the present invention. FIGS. 1 and 2 indicate the length L of the capacitor element, the width W of the capacitor element, and the height H of the capacitor element.

As illustrated in FIG. 1, the capacitor element 10a having the first configuration and included in the electronic component according to the present preferred embodiment of the present invention includes a multilayer body 11a that is a rectangular or substantially rectangular parallel or parallelepiped or substantially parallelepiped shape and in which dielectric layers 13 and planar internal electrodes 12 are alternatingly stacked, and external electrodes 14 that are provided on the multilayer body 11a and positioned at the surface of each end in the length L direction of the capacitor element 10a.

In internal electrodes 12, which are adjacent to each other and face each other, one of the internal electrodes 12 is electrically connected to one of the external electrodes 14 positioned at one end of the capacitor element 10a in the length L direction, and the other of the internal electrodes 12 is electrically connected to another one of the external electrodes 14 positioned at the other end of the capacitor element 10a in the length L direction.

In the capacitor element 10a having the first configuration, the stacking direction of the dielectric layers 13 and the internal electrodes 12 is perpendicular or substantially perpendicular to the length L direction and the height H direction of the capacitor element 10a. That is, the stacking direction of the dielectric layers 13 and the internal electrodes 12 is parallel or substantially parallel to the width W direction of the capacitor element 10a.

As illustrated in FIG. 2, the capacitor element 10b having the second configuration and included in the electronic component according to a preferred embodiment of the present invention includes a multilayer body 11b that is a rectangular or substantially rectangular parallel or parallelepiped or substantially parallelepiped shape and in which dielectric layers 13 and planar internal electrodes 12 are alternatingly stacked, and external electrodes 14 that are provided on the multilayer body 11b and positioned at the surface of each end in the length L direction of the capacitor element 10b.

In the internal electrodes 12, which are adjacent to each other and face each other, one of the internal electrodes 12 is electrically connected to one of the external electrodes 14 positioned at one end of the capacitor element 10b in the length L direction, and the other of the internal electrodes 12 is electrically connected to another one of the external electrodes 14 positioned at the other end of the capacitor element 10b in the length L direction.

In the capacitor element 10b having the second configuration, the stacking direction of the dielectric layers 13 and the internal electrodes 12 is perpendicular or substantially perpendicular to the length L direction and the width W direction of the capacitor element 10b. That is, the stacking direction of the dielectric layers 13 and the internal electrodes 12 is parallel or substantially parallel to the height H direction of the capacitor element 10a.

In the present preferred embodiment, the dielectric layers 13 are preferably made of a ceramic sheet that mainly includes barium titanate or the like. However, the principal component making up the dielectric layers 13 is not limited to barium titanate, provided that a ceramic preferably having a high dielectric constant is used, such as calcium titanate, strontium titanate, and so on. The dielectric layers 13 may also include at least one secondary component, such as a manganese compound, an iron compound, a chromium compound, a cobalt compound, a nickel compound, and so on. Also, the dielectric layer 13 may include silicon, glass components, and so on.

Any of a capacitor element having an electrostatic capacitance of substantially no less than 1 μF, a capacitor element having a relative dielectric constant of substantially no less than 3000, a capacitor element in which the quantity of internal electrodes 12 is substantially no less than 350, a capacitor element in which the thickness of one layer among the dielectric layers 13 is no more than 1 μm, and so on are preferably used as the capacitor element 10a, 10b, for example.

The internal electrodes 12 are formed preferably by printing with a paste that includes nickel over the ceramic sheet forming the dielectric layers 13. However, the principal material for the internal electrodes 12 is not limited to nickel, and may also be alloyed with palladium and silver, or the like, for example.

The external electrodes 14 are each formed by baking a conductive paste onto the multilayer body 11a, 11b, or by plating onto the multilayer body 11a, 11b. The external electrodes 14 have a multilayer structure in which metal films of nickel, tin, and so on are stacked sequentially.

In the present preferred embodiment, the external electrodes 14 are provided at each of two ends of the capacitor element 10a, 10b in the length L direction, so as to cover an end surface and portions of four side surfaces of the capacitor element 10a, 10b, where the end surface is perpendicular or substantially perpendicular to the length L direction, and the four side surfaces are connected to the end surface. However, the external electrodes 14 may also be provided on the capacitor element 10a, 10b at least on a surface disposed opposite a later-described substrate terminal. Here, in order to achieve mounting stability in the capacitor element 10a, 10b, the external electrodes 14 are preferably provided on both of the end surfaces of the capacitor element 10a, 10b.

The electronic component according to the present preferred embodiment is described below.

Figure 3:
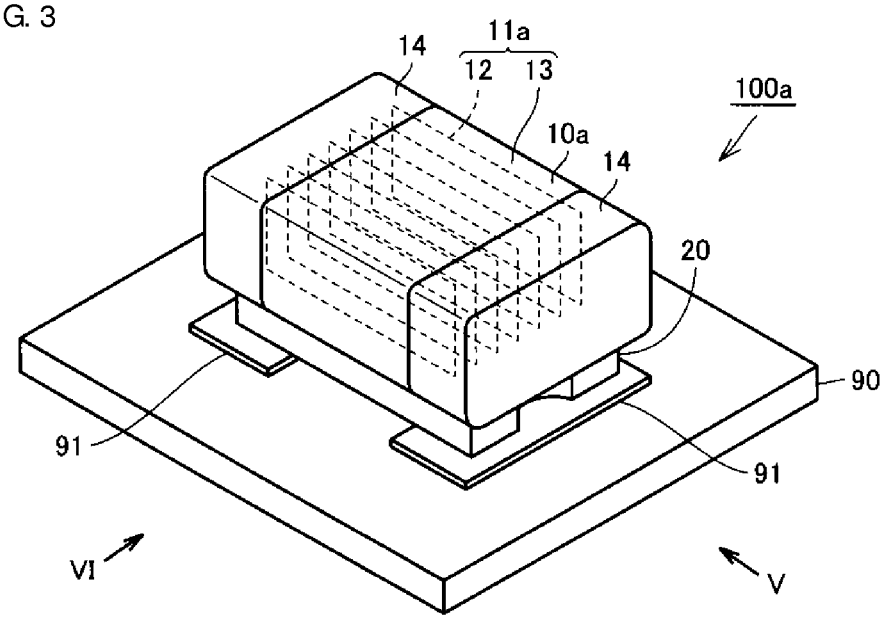
FIG. 3 is a perspective view illustrating the electronic component according to a preferred embodiment of the present invention that includes the capacitor element having the first configuration as the electronic element, when mounted on a circuit substrate.
Figure 4:
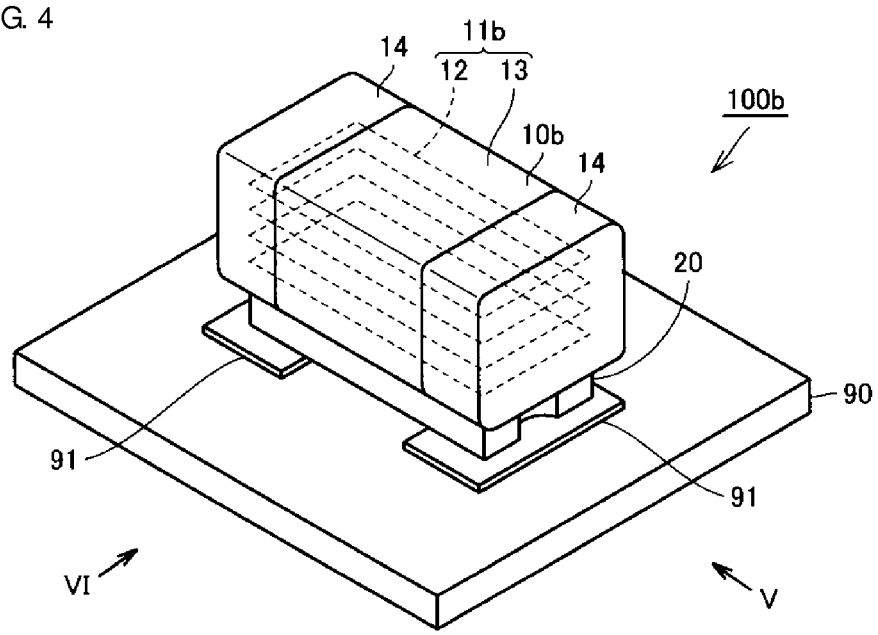
FIG. 4 is a perspective view illustrating the electronic component according to a preferred embodiment of the present invention that includes the capacitor element having the second configuration as the electronic element, when mounted on a circuit substrate.
Figure 5:
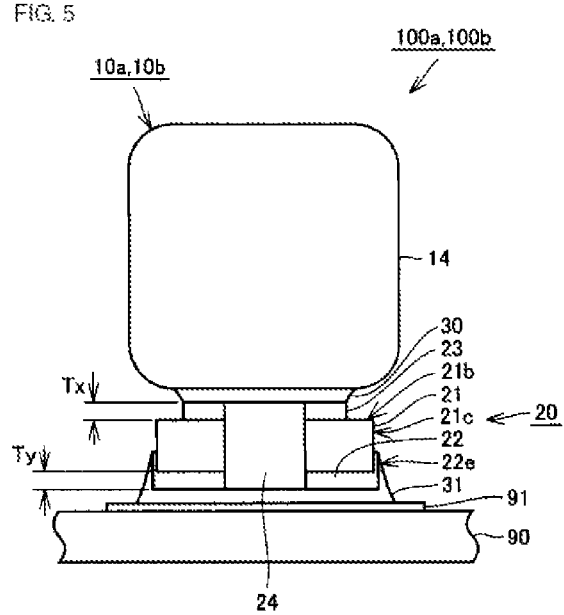
FIG. 5 is a diagram of the electronic component illustrated in FIGS. 3 and 4 as seen along the direction of arrow V.
Figure 6:
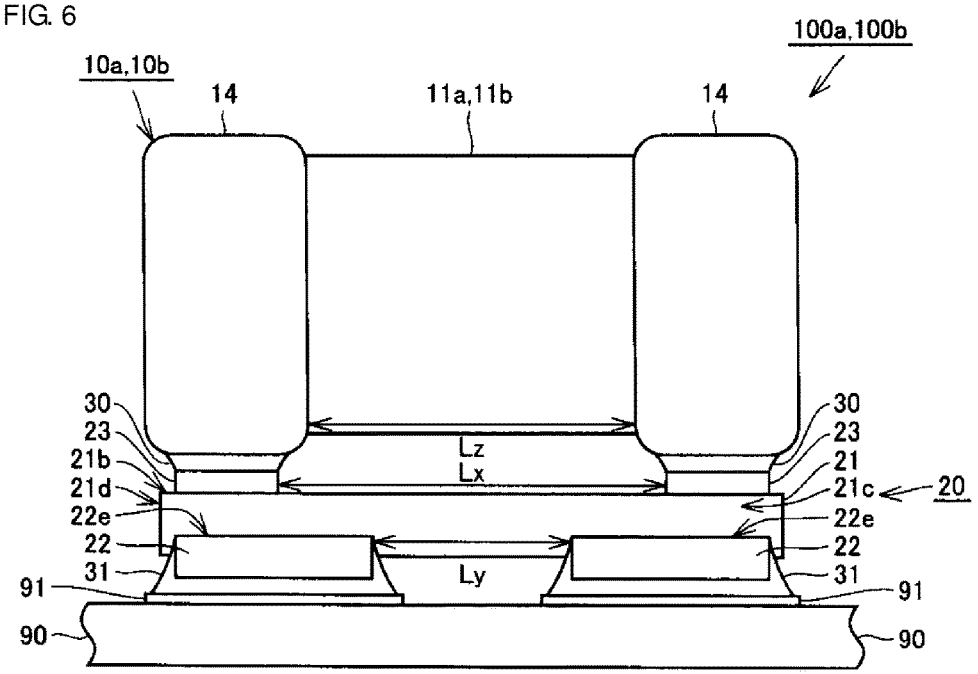
FIG. 6 is a diagram of the electronic component illustrated in FIGS. 3 and 4 as seen along the direction of arrow VI.
Figure 7:
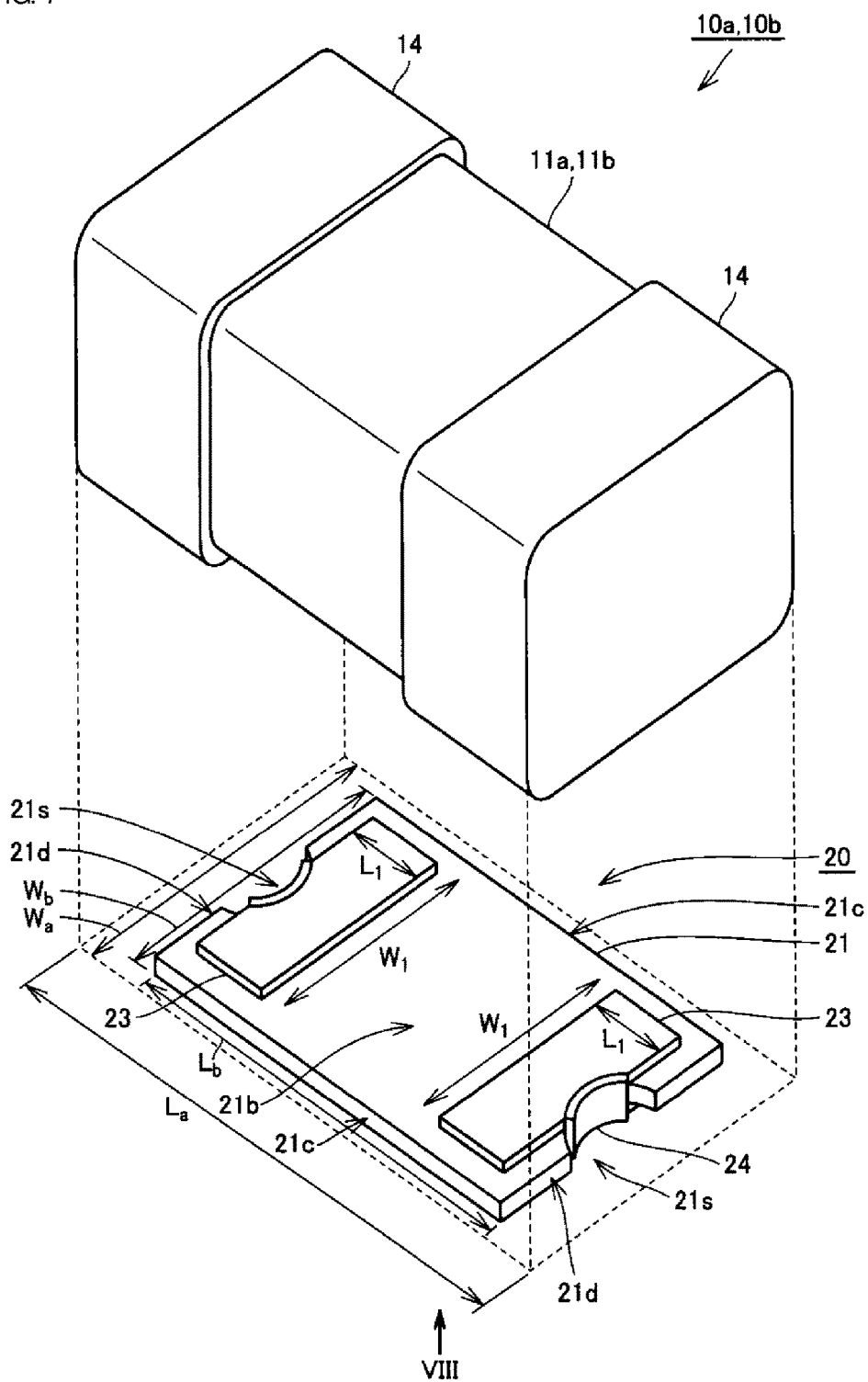
FIG. 7 is an exploded perspective view of the electronic component according to a preferred embodiment of the present invention.
Figure 8:
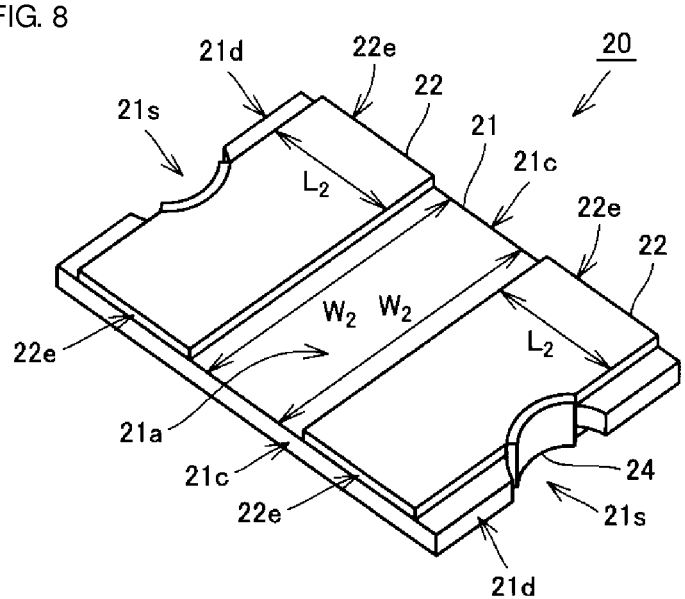
FIG. 8 is a diagram of a substrate terminal included in the electronic component in FIG. 7 as seen along the direction of arrow VIII.

FIG. 3 is a perspective view illustrating the electronic component according to the present preferred embodiment that includes the capacitor element having the first configuration as the electronic element, when mounted on a circuit substrate. FIG. 4 is a perspective view illustrating the electronic component according to the present preferred embodiment that includes the capacitor element having the second configuration as the electronic element, when mounted on a circuit substrate. FIG. 5 represents the electronic component illustrated in FIGS. 3 and 4 as seen along the direction of arrow V. FIG. 6 represents the electronic component illustrated in FIGS. 3 and 4 as seen along the direction of arrow VI. FIG. 7 is an exploded perspective view of the electronic component according to the present preferred embodiment. FIG. 8 represents a substrate terminal included in the electronic component in FIG. 7 as seen along the direction of arrow VIII. FIG. 7 does not illustrate the conductor included in the electronic component.

As seen in FIGS. 3 through 8, an electronic component 100a, 100b according to the present preferred embodiment each includes the capacitor element 10a, 10b including the external electrodes 14 at a surface thereof, and a substrate terminal 20 on which the capacitor element 10a, 10b is mounted. As seen in FIGS. 3 through 6, the circuit substrate 90 includes lands 91 that are each connected to later-described connection electrodes 22 of the substrate terminal 20.

As illustrated in FIGS. 5 through 8, the substrate terminal 20 included in the electronic component 100a, 100b according to the present preferred embodiment includes an insulating substrate 21. In the present preferred embodiment, the insulating substrate 21 has an external shape that preferably is rectangular or substantially rectangular as seen in a plan view, i.e., as seen from the height H direction that is perpendicular or substantially perpendicular to a first main surface of the substrate terminal 20, described in more detail below. However, the external shape of the insulating substrate 21 is not limited to being rectangular or substantially rectangular, and may, for example, be an oval or substantially oval shape or the like. The insulating substrate 21 may also be chamfered at corners and edges, for example.

The insulating substrate 21 includes a first main surface 21a, a second main surface 21b opposite the first main surface 21a, and a peripheral surface joining the first main surface 21a and the second main surface 21b. The peripheral surface of the insulating substrate 21 includes a pair of mutually-opposing side surfaces 21c, and a pair of mutually-opposing end surfaces 21d positioned to join the side surfaces 21c.

The material for the insulating substrate 21 may be a resin material such as an epoxy resin, or a ceramic material such as aluminum oxide. Also, a filler or fiber made from one of an inorganic material and an organic material may be added to the insulating substrate. In the present preferred embodiment, a glass epoxy substrate made up of an epoxy resin to which glass fiber has been added is used as the insulating substrate 21.

In order to significantly reduce or prevent the propagation of vibrations, the thickness of the insulating substrate 21 is preferably substantially no less than about 0.05 mm and substantially no more than about 0.4 mm, for example. Specifically, in order to significantly reduce or prevent the propagation of vibrations, the insulating substrate 21 preferably has low rigidity. As such, the thickness of the insulating substrate 21 is preferably substantially no more than about 0.4 mm.

Conversely, when the insulating substrate 21 is overly thin, the solder joining the electronic component 100a, 100b to the lands 91 of the circuit substrate 90 may wet to and reach the capacitor element 10a, 10b, which may then form fillets at the edges of the capacitor element 10a, 10b in the length L direction. Such circumstances are not preferable, as vibrations propagate from the capacitor element 10a, 10b to the circuit substrate 90 through these fillets. Accordingly, in order to prevent solder wetting, the thickness of the insulating substrate 21 is preferably substantially no less than 0.05 mm.

As illustrated in FIG. 7, a maximum width $W_b$ of the substrate terminal 20 is less than a maximum width $W_a$ of the capacitor element 10a, 10b in terms of a width of the insulating substrate 21, which is parallel or substantially parallel to the length direction that is along the end surfaces 21d joining the side surfaces 21c in the insulating substrate 21. A maximum length $L_b$ of the substrate terminal 20 is less than a maximum length $L_a$ of the capacitor element 10a, 10b in terms of a length of the insulating substrate 21, which is parallel or substantially parallel to the length direction that is along the side surfaces 21c joining the end surfaces 21d in the insulating substrate 21.

As illustrated in FIGS. 3, 4, and 7, in the present preferred embodiment, the substrate terminal 20 is entirely covered by the capacitor element 10a, 10b as seen in a plan view.

In order to achieve mounting stability in the capacitor element 10a, 10b, the minimum length of the insulating substrate 21 is preferably substantially about 0.8 times or more, and more preferably substantially about 0.9 times or more, the maximum length of the capacitor element 10a, 10b. The minimum width of the insulating substrate 21 is preferably substantially about 0.8 times or more, and more preferably substantially about 0.9 times or more, the maximum width of the capacitor element 10a, 10b.

As illustrated in FIGS. 7 and 8, in the present preferred embodiment, both ends of the insulating substrate 21 in the length direction are each provided with a notch 21s that preferably is semicircular or substantially semicircular as seen in a plan view. As illustrated in FIGS. 3, 4, and 7, when seen in a plan view, each notch 21s is covered by the capacitor element 10a, 10b. However, the shape of the notch 21s as seen in the plan view is not limited to being circular or substantially semicircular but may also be polygonal or substantially polygonal or similar shapes.

Providing the notches 21s enables the solder joining the electronic component 100a, 100b to the lands 91 of the circuit substrate 90 to pool in spaces formed by the notches 21s. Accordingly, wetting of the solder to both ends in the length L direction of the capacitor element 10a, 10b is significantly reduced or prevented. Also, this serves to improve stability in the mounting orientation of the electronic component 100a, 100b when the solder forming a later-described conductor 31 is provided in excess. However, the notches 21s need not necessarily be provided.

As illustrated in FIGS. 5, 6, and 7, the substrate terminal 20 is provided at the second main surface 21b of the insulating substrate 21 and includes mounting electrodes 23 that are electrically connected to the external electrodes 14 of the capacitor element 10a, 10b. Specifically, two mounting electrodes 23 are arranged with mutual separation along the length direction of the insulating substrate 21. The maximum thickness Tx of the mounting electrodes 23 illustrated in FIG. 5 preferably is substantially no less than about 10 μm and substantially no more than about 50 μm, for example.

As illustrated in FIG. 7, as seen in a plan view, each of the mounting electrodes 23 is at separation from the end surface 21d of the insulating substrate 21. The mounting electrodes 23 do not include a later-described adjacent portion.

As illustrated in FIGS. 5, 6, and 8, the substrate terminal 20 is provided at the first main surface 21a of the insulating substrate and includes connection electrodes 22 that are electrically connected to the lands 91 of the circuit substrate 90. Specifically, two connection electrodes 22 are arranged with mutual separation along the length direction of the insulating substrate 21.

The maximum thickness $T_y$ of the connection electrodes 22 illustrated in FIG. 5 preferably is, for example, substantially no less than about 10 μm and substantially no more than about 50 μm, for example. Also, the thickness $T_y$ of the connection electrodes 22 positioned on the second main surface 21b of the insulating substrate 21 does not include the thickness of later-described burrs on the connection electrodes 22.

Preferably, the maximum thickness $T_y$ of the connection electrodes 22 preferably is substantially no less than about 20 μm and substantially no more than about 40 μm, for example. When the maximum thickness $T_y$ of the connection electrode 22 preferably is substantially less than about 20 μm, then the fillets of the conductor 31 are not sufficiently formed, causing instability in the mounting orientation of the electronic component 100a, 100b. When the maximum thickness $T_y$ of the connection electrodes 22 is substantially greater than about 40 μm, then the electronic component 100a, 100b is overly tall in height, which is not preferable for low-profile mounting.

In order to achieve low-profile mounting, the maximum thickness $T_x$ of the mounting electrodes 23 is preferably less than the maximum thickness $T_y$ of the connection electrodes 22.

As illustrated in FIGS. 7 and 8, the width $W_2$ of the connection electrodes 22 is greater than the width $W_1$ of the mounting electrodes 23. The length $L_2$ of the connection electrodes 22 is greater than the length $L_1$ of the mounting electrodes 23.

As illustrated in FIG. 6, the minimum separation $L_y$ between the connection electrodes 22 is preferably less than the minimum separation $L_z$ between the external electrodes 14 of the capacitor element 10a, 10b. Also, the minimum separation $L_y$ between the connection electrodes 22 is preferably less than the minimum separation $L_x$ between the mounting electrodes 23. Accordingly, the connection electrodes 22 enable the solder that defines the conductor 31 to wet over a larger surface area. As a result, this serves to improve stability in the mounting orientation of the electronic component 100a, 100b when the solder used as the conductor 31 is provided in excess.

The connection electrodes 22 each include an adjacent portion 22e which is a portion that is adjacent to the peripheral surface of the substrate terminal 20 with respect to at least one of the length direction of the insulating substrate 21, the width direction of the insulating substrate 21, and the height direction of the insulating substrate 21.

The substrate terminal 20 includes a through-electrode 24 that is electrically connected to the mounting electrodes 23 and the connection electrodes 22. As illustrated in FIGS. 5, 7, and 8, in the present preferred embodiment, the through-electrode 24 is provided along the wall surface of the notches 21s.

As described later, the solder wets over the through-electrode 24 when the electronic component 100a, 100b is each mounted on the circuit substrate 90. As a result, the mounting orientation of the electronic component 100a, 100b is stabilized.

Enlarging the notches 21s and the through-electrode 24, and increasing the surface area of solder wet in the through-electrode 24 improves stability of the mounting orientation for the electronic component 100a, 100b.

However, over-enlarging the notches 21s decreases the joining strength between the capacitor element 10a, 10b and the substrate terminal 20. In order to increase the surface area for solder wet at the through-electrodes 24 while maintaining the joining strength between the capacitor element 10a, 10b and the substrate terminal 20, the shape of the notches 21s as seen in a plan view is preferably half-oval, substantially half-oval, half-ellipsoid or substantially half-ellipsoid, which has a major axis parallel or substantially parallel to the width direction of the insulating substrate 21. That is, the shape of the notches 21s as seen in a plan view is preferably such that half the dimension of each of the notches 21s along the width direction of the insulating substrate 21 is larger than the full dimension of each of the notches 21s along the length direction of the insulating substrate 21.

However, the through-electrode 24 need not be provided along the wall surface of the notches 21s, but may also be provided within a through-hole in the insulating substrate 21.

In the present preferred embodiment, the external electrodes 14 of the capacitor element 10a, 10b and the mounting electrodes 23 of the substrate terminal 20 are physically and electrically connected via the conductor 30 that is made of solder. However, the conductor 30 is not limited to being made of solder, and may also be formed of a conductive adhesive.

The connection electrodes 22 of the substrate terminal 20 and the lands 91 of the circuit substrate 90 are physically and electrically connected via the conductor 31 that is made of solder. However, the conductor 31 is not limited to being made of solder, and may also be formed of a conductive adhesive.

As described later, the adjacent portion 22e may include burrs of the connection electrodes 22 in some case. The conductor 31 fixes the burrs of the connection electrodes 22. However, the conductor 31 need only fix at least a portion of the burrs of the connection electrodes 22.

As illustrated in FIGS. 3 through 6, the electronic component 100a, 100b is each mounted over the circuit substrate 90. Accordingly, the capacitor element 10a, 10b and the circuit substrate 90 are connected, having the substrate terminal 20 sandwiched therebetween.

As described above, mounting the electronic component 100a, 100b over the circuit substrate 90 attenuates the vibrations produced by the capacitor element 10a, 10b upon propagation to the substrate terminal 20, which enables a reduction in audible noise produced upon propagation of the vibrations to the circuit substrate 90.

A non-limiting example of a manufacturing method for the electronic component according to the present preferred embodiment is described below. The manufacturing method for the substrate terminal 20 is described first.

Figure 9:
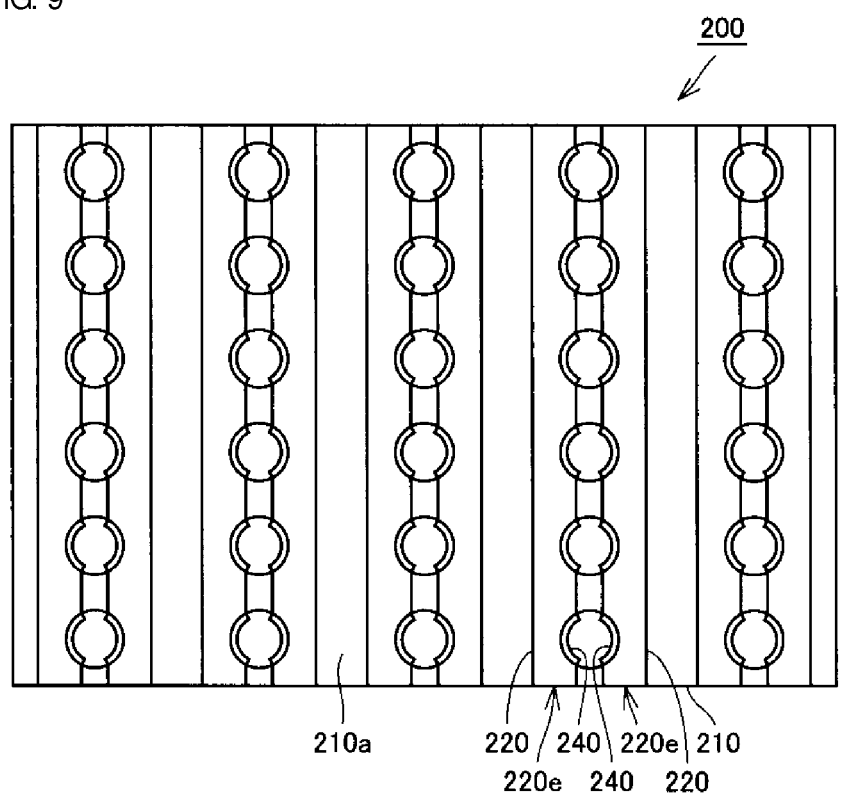
FIG. 9 is a diagram of a motherboard serving as the base for the substrate terminal included in the electronic component according to a preferred embodiment of the present invention, as seen from the first main surface side.
Figure 10:
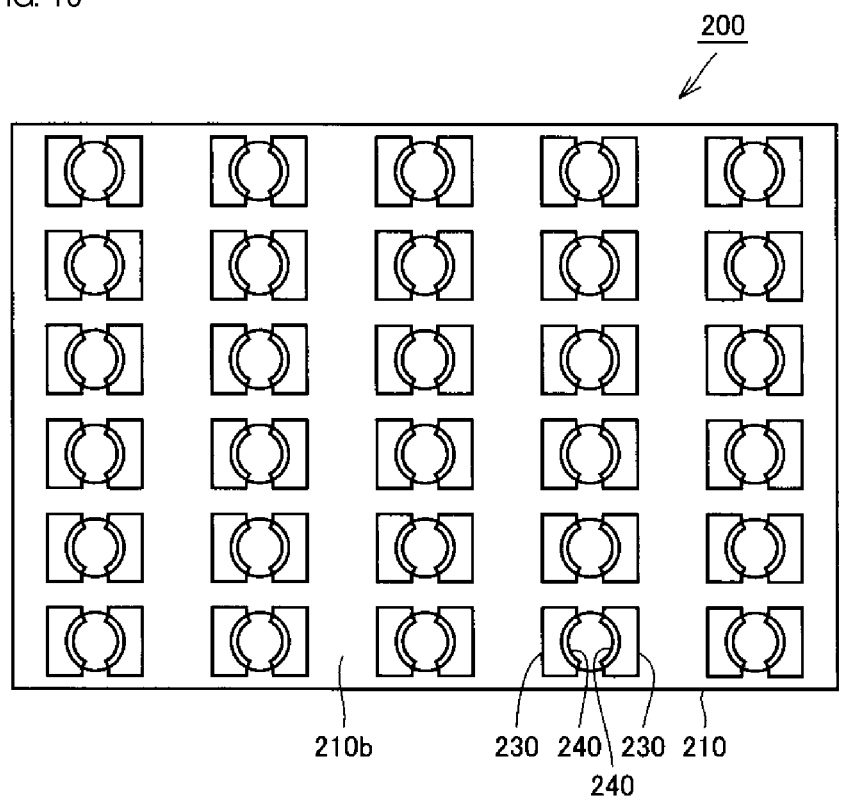
FIG. 10 is a diagram of the motherboard serving as the base for the substrate terminal included in the electronic component according to a preferred embodiment of the present invention, as seen from the second main surface side.

FIG. 9 is a diagram of a motherboard serving as the base for the substrate terminal included in the electronic component according to the present preferred embodiment, as seen from the first main surface side. FIG. 10 is a diagram of the motherboard serving as the base for the substrate terminal included in the electronic component according to the present preferred embodiment, as seen from the second main surface side.

First, as illustrated in FIGS. 9 and 10, a motherboard 200 is prepared having a first main surface 210a and a second main surface 210b on which respective wiring patterns are formed at mutually-opposing positions. The motherboard 200 is, for example, manufactured as follows.

Via-holes 240 are formed in a dual-sided copper-clad laminate that includes the insulating substrate 210 and that is substantially rectangular as seen in a plan view, and electrodes 220 of the first main surface 210a and electrodes 230 of the second main surface 210b are made conductive. Next, an etching process or similar is used to form respective wiring patterns on the first main surface 210a and the second main surface 210b.

In the present preferred embodiment, in order to perform electroplating in a later-described step, at least the wiring pattern on the first main surface 210a is formed such that a plurality of the electrodes 220 are linked together by linkers 220e. As illustrated in FIG. 9, in the present preferred embodiment, the linkers 220e extend linearly in the width direction of the motherboard 200. Here, the width direction of the motherboard 200 corresponds to the width direction of the substrate terminal 20, and the length direction of the motherboard 200 corresponds to the length direction of the substrate terminal 20.

The length of the linkers 200e along the length direction of the motherboard 200 is preferably substantially no less than about 0.10 mm in order to improve conductivity during electroplating.

The wiring pattern for the second main surface 210b is formed with individual electrodes 230 arranged in a matrix. As described above, since the electrodes 230 are conductive with the electrodes 220 through the via-holes 240, electroplating is also applicable to the electrodes 230 arranged in the matrix.

Next, a nickel film is formed by electroplating over the wiring pattern, which is made of copper, and a tin film is further formed by electroplating over the nickel film. During electroplating, a plating terminal is provided at one edge along the width direction of the motherboard 200, which enables direct current to flow across all of the electrodes 220, 230 and the via-holes 240.

If the tin film is formed using electroless plating over the wiring pattern made of copper, whiskers are likely to form due to stress on the two metals. When whiskers scatter over the circuit substrate 90 with the electronic component 100a, 100b mounted thereon, short-circuiting may occur in the circuit substrate 90. Thus, in the present preferred embodiment, the use of electroplating enables reduction of the occurrence of whiskers on the electrodes and prevention of short-circuiting in the circuit substrate 90.

In order to significantly reduce or prevent burr formation, the thickness of the nickel film is preferably substantially no less than about 1 μm and more preferably substantially no less than about 3 μm. In order to achieve sufficient bondability with the solder, the thickness of the tin layer is preferably substantially no less than 1 μm, for example.

Figure 11:
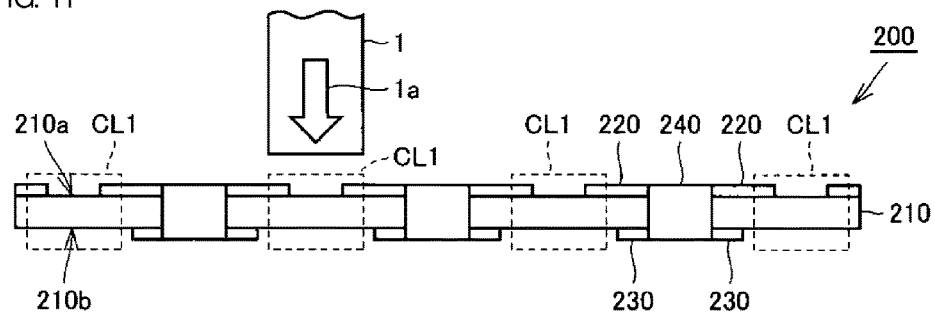
FIG. 11 is a cross-sectional view illustrating the motherboard as cut by a dicing blade, in a preferred embodiment of the present invention.
Figure 12:
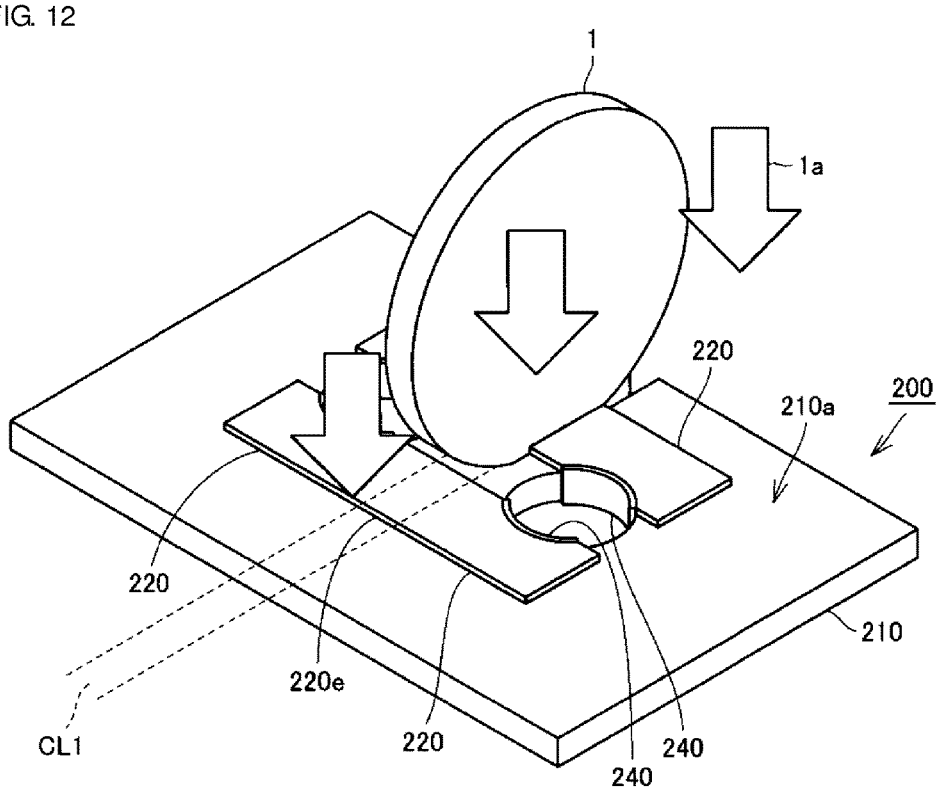
FIG. 12 is a perspective view illustrating the motherboard as cut by the dicing blade in a preferred embodiment of the present invention.
Figure 13:
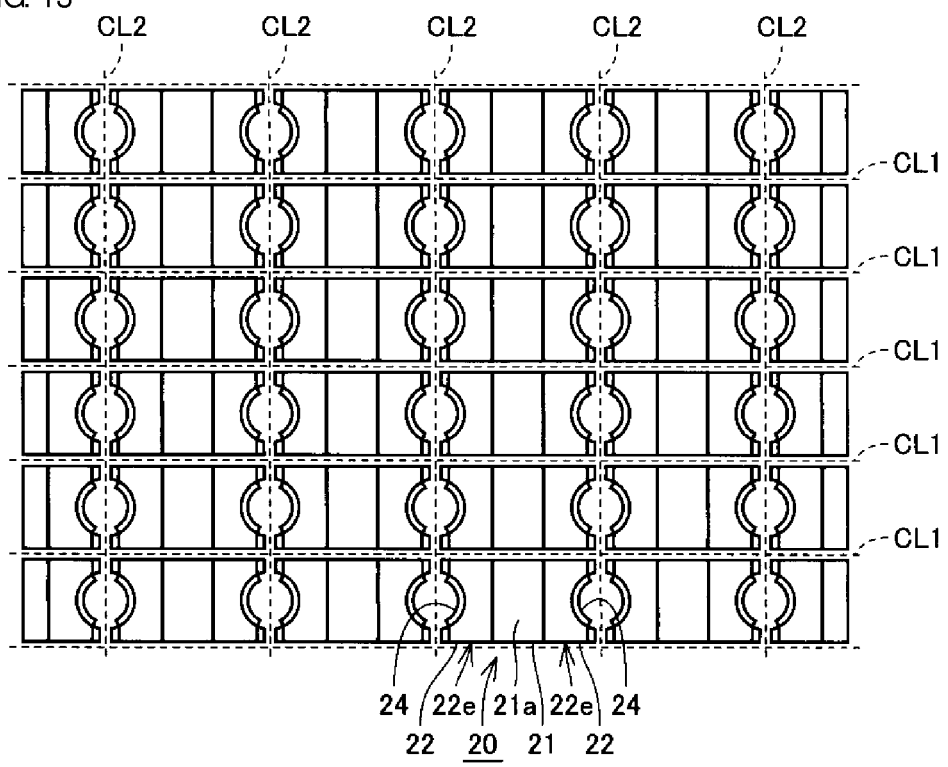
FIG. 13 is a diagram of the cut motherboard as seen from the first main surface side in a preferred embodiment of the present invention.
Figure 14:
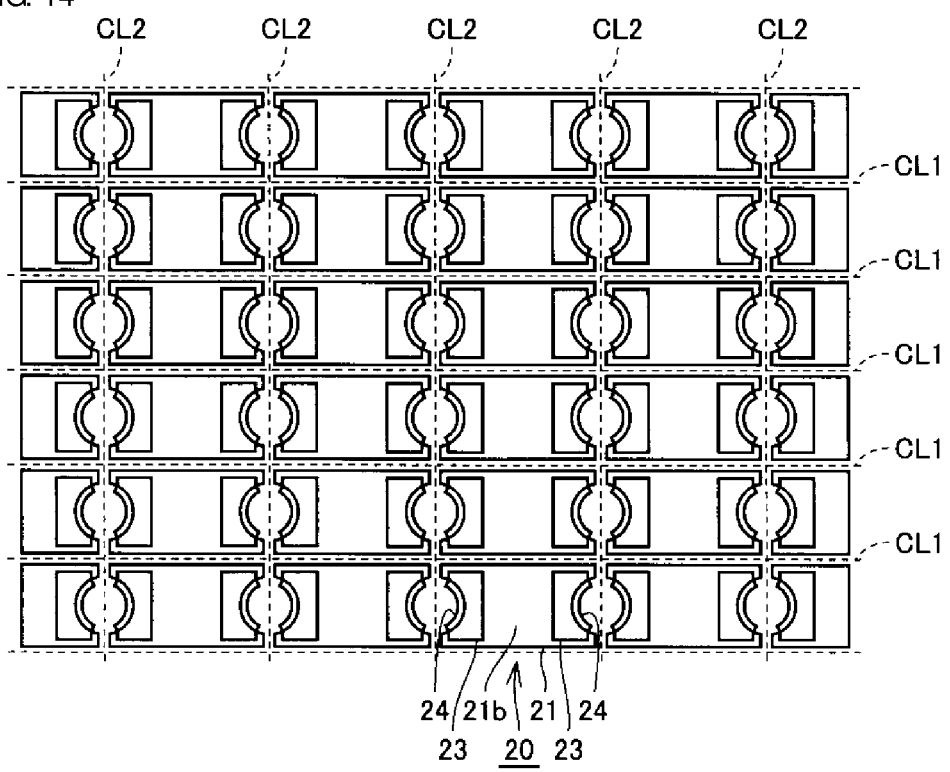
FIG. 14 is a diagram of the cut motherboard as seen from the second main surface side in a preferred embodiment of the present invention.
Figure 15:
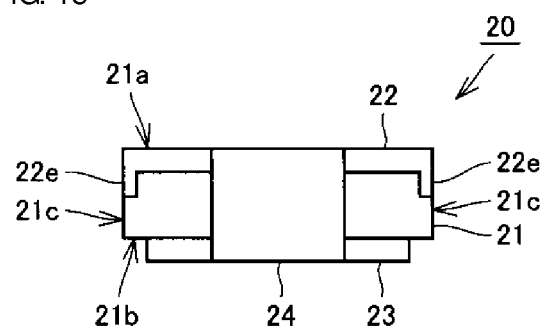
FIG. 15 is a diagram of a separated substrate terminal as seen from an end surface side.

The motherboard 200 manufactured as described above is cut and separated into the substrate terminal 20. FIG. 11 is a cross-sectional view illustrating the motherboard as being cut by a dicing blade in the present preferred embodiment. FIG. 12 is a perspective view illustrating the motherboard as being cut by the dicing blade in the present preferred embodiment. FIG. 13 illustrates the cut motherboard from the first main surface side in the present preferred embodiment. FIG. 14 illustrates the cut motherboard from the second main surface side in the present preferred embodiment. FIG. 15 illustrates the separated substrate terminal from the end surface side.

As illustrated in FIGS. 11 through 15, cutting the motherboard 200 along virtual cut lines CL1, CL2 separates the motherboard 200 into the substrate terminals 20.

Specifically, the motherboard 200 is cut from the first main surface 210a side toward the second main surface 210b side along the cut lines CL1, CL2, which intersect the wiring pattern on the first main surface 210a and do not intersect the wiring pattern on the second main surface 210b.

The cut line CL1 is a virtual line for forming the side surface of the substrate terminal 20, and the cut line CL2 is a virtual line for forming the end surface of the substrate terminal 20. In the present preferred embodiment, the cut lines CL1 and CL2 define a grid.

In the present preferred embodiment, cutting of the motherboard 200 is performed with the motherboard 200 affixed to a cutting support member. Specifically, a foam peeling sheet is affixed to the second main surface 210b of the motherboard 200. The foam peeling sheet is a resin sheet that is adhesive on a surface, and that when heated, foams to reduce adhesive power.

As illustrated in FIGS. 11 and 12, the motherboard 200a is cut with a dicing blade 1 from the first main surface 210a side. Preferably, the motherboard 200 is cut by displacing the dicing blade 1 as shown by arrow 1a, along the direction perpendicular or substantially perpendicular to the first main surface 210a.

That is, once the dicing blade 1 has been displaced along a direction perpendicular or substantially perpendicular to the first main surface 210a and has cut a portion of the motherboard 200, the dicing blade 1 is then displaced by sliding along cut lines CL1, CL2 over the motherboard 200 and is once again displaced along the direction perpendicular or substantially perpendicular to the first main surface 210a to cut another portion of the motherboard 200. These processes are repeated to cut the motherboard 200.

The linker 220e is positioned across the cut line CL1 on the first main surface 210a of the motherboard 200. That is, the wiring pattern on the first main surface 210a and the cut line CL1 intersect. As such, the linker 220e is cut by the dicing blade 1.

Cutting the motherboard 200 by displacing the dicing blade 1 along the direction perpendicular or substantially perpendicular to the first main surface 210a as described above significantly reduces or prevents the formation of burrs at the cut portion of the linker 220e. Specifically, when the linker 220e is cut by the dicing blade 1, the insulating substrate 210 is positioned below the linker 220e and thus, the cut portion of the linker 220e is prevented from being extended by the dicing blade due to the presence of the insulating substrate 210. As a result, the formation of burrs due to extension of the cut portion of the linker 220e is prevented.

The cut portion of the linker 220e is the adjacent portion 22e. Once the linker 220e has been cut, the electrodes 220 become the connection electrodes 22. As a result of performing the electroplating as described above, the connection electrodes 22 include two adjacent portions 22e each respectively adjacent to one of the pair of side surfaces 21c on the insulating substrate 21. Any burrs on the cut portion of the linker 220e become burrs of the connection electrodes 22.

The electrodes 230 are not positioned along the cut lines CL1, CL2 on the second main surface 210b of the motherboard 200. That is, the wiring pattern on the second main surface 210b and the cut line CL1, CL2 do not intersect. As such, burrs are prevented from forming on the mounting electrodes 23.

The through-electrode is not positioned along the cut lines CL1, CL2 in the via-holes 240 of the motherboard 200. As such, burrs are prevented from forming on the through-electrode 24.

As illustrated in FIG. 15, in the separated substrate terminal 20, a portion of the adjacent portion 22e is in film form and covers the side surface 21c of the insulating substrate 21. This is a portion of the cut portion of the linker 220e that is extended along the side surface 21c of the insulating substrate 21 while being pressed by the side surface 21c of the insulating substrate 21 and is thus in film form. This piece is affixed to the side surface 21c of the insulating substrate 21 and does not easily peel off from the insulating substrate 21. Thus, cutting the linker 220e from the first main surface 210a side enables significant reduction or prevention of the occurrence of mounting defects in the electronic component 100a, 100b due to burrs in the connection electrode 22, even in circumstances where the cut portion of the linker 220e is extended.

Figure 16:
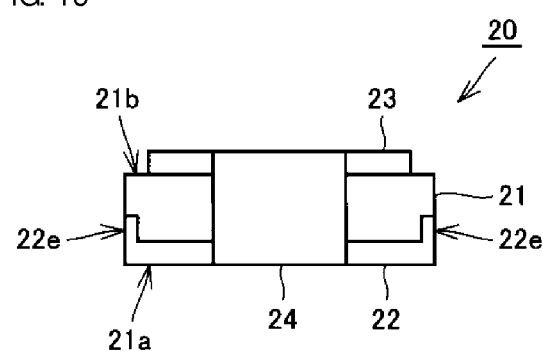
FIG. 16 is a diagram of an electronic component according to a preferred embodiment of the present invention when the substrate terminal having the electronic element mounted thereon is viewed from the end surface side.
Figure 17:
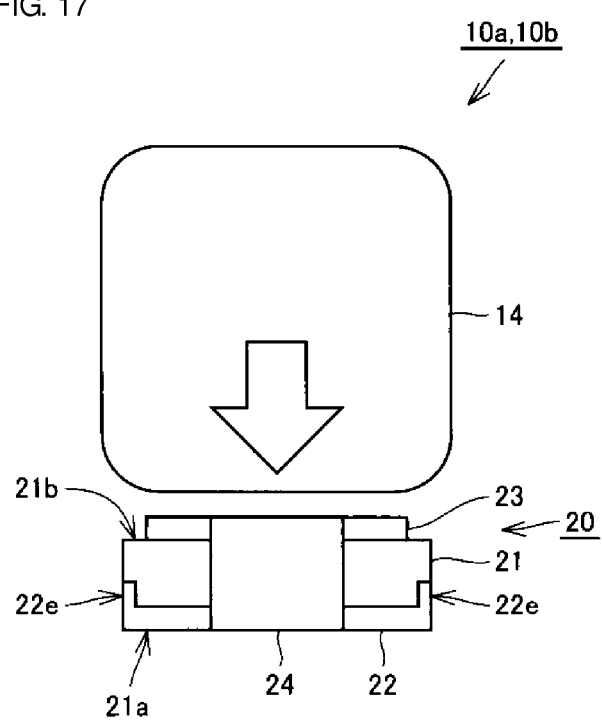
FIG. 17 is a diagram of the electronic component according to a preferred embodiment of the present invention when the electronic element is being mounted on the substrate terminal.

FIG. 16 illustrates the electronic component according to the present preferred embodiment when the substrate terminal having the electronic element mounted thereon is viewed from the end surface side. FIG. 17 illustrates the electronic component according to the present preferred embodiment when the electronic element is being mounted on the substrate terminal.

As illustrated in FIGS. 16 and 17, in the electronic component 100a, 100b according to the present preferred embodiment, the capacitor element 10a, 10b is mounted onto the substrate terminal 20 at the second main surface 21b of the insulating substrate 21.

Thus, after the motherboard 200 has been cut and before the substrate terminal 20 is removed from the cutting support member, a substitute support member is affixed to the first main surface 210a of the motherboard 200. The substitute support member is a foam peeling sheet, but undergoes the decrease in adhesive power at a higher temperature in comparison to the foam peeling sheet used as the cutting support member.

The motherboard 200 having the substitute support member adhering thereto is heated to a temperature that is no less than the temperature at which the cutting support member undergoes the decrease in adhesive power and no more than the temperature at which the substitute support member undergoes the decrease in adhesive power so that only the adhesive power of the cutting support member is lowered. Peeling away the cutting support member causes the separated substrate terminal 20 to be supported by the substitute support member.

Afterward, a solder paste is applied to the mounting electrodes 23 of the substrate terminal using, for instance, a screen printing method. Next, as illustrated in FIGS. 5 and 6, the capacitor element 10a, 10b is placed over the substrate terminal 20 and reflow is performed such that the solder paste adheres to the external electrodes 14. The reflow causes the solder paste to melt and afterward solidify, forming the conductor 30, 31. Accordingly, the capacitor element 10a, 10b is mounted on the substrate terminal 20, and the electronic component 100a, 100b is manufactured. The electronic component 100a, 100b is removed from the substitute support member, which has reduced adhesive power due to heating.

In the electronic component 100a, 100b according to the present preferred embodiment, the connection electrodes 22 are connected to the lands 91 of the circuit substrate 90. As illustrated in FIGS. 5 and 6, when a portion of the adjacent portion 22e covers the side surface 21c of the insulating substrate 21, fillets are likely to form in the solder (conductor 31) connecting the substrate terminal 20 and the circuit substrate 90. As a result, improvements to the mounting stability of the electronic component 100a, 100b onto the circuit substrate 90 are possible.

The electronic component 100a, 100b manufactured through the steps described above is contained in a carrier tape on which a multitude of cavities, each containing one of the electronic component 100a, 100b, are aligned in a row. When mounting the electronic component 100a, 100b onto the circuit substrate 90, the electronic component 100a, 100b is removed from the carrier tape and mounted one at a time.

In the electronic component 100a, 100b according to the present preferred embodiment, the formation of burrs on the connection electrodes 22 is prevented, which enables significant reduction or prevention of any mounting defects of the electronic component 100a, 100b caused by the burrs of the connection electrodes 22. Specifically, short-circuits in the circuit substrate 90 caused by burrs of the connection electrodes 22 falling onto the circuit substrate 90 are prevented.

Because at least a portion of the burrs on the connection electrodes 22 are fixed by the conductor 31, any burrs of the connection electrodes 22 falling onto the circuit substrate 90 are prevented from causing a short-circuit of the circuit substrate 90.

In the electronic component 100a, 100b according to the present preferred embodiment, in terms of the width of the insulating substrate 21, the maximum width $W_b$ of the substrate terminal 20 is less than the maximum width $W_a$ of the capacitor element 10a, 10b. In terms of the length of the insulating substrate 21, the maximum length $L_b$ of the substrate terminal 20 is less than the maximum width $L_a$ of the capacitor element 10a, 10b. The substrate terminal 20 is entirely covered by the capacitor element 10a, 10b as seen in a plan view. Accordingly, the electronic component 100a, 100b is miniaturized. As a result, on the circuit substrate 90, the electronic component 100a, 100b is mountable in plurality with narrow spacing between each individual electronic component 100a, 100b.

In the electronic component 100a, 100b according to the present preferred embodiment, in terms of the width of the insulating substrate 21, the maximum width $W_2$ of the connection electrodes 22 is greater than the maximum width $W_1$ of the mounting electrodes 23. Accordingly, this enables surface area to be secured for the connection electrodes 22 where the conductor 31 wets over, and enables the mounting stability of the electronic component 100a, 100b to be maintained.

Particularly, in the electronic component 100a, 100b having the miniaturized substrate terminal 20 as described above, the mounted electronic component 100a, 100b is prone to tilting. However, having the maximum width $W_2$ of the connection electrodes 22 be greater than the maximum width $W_1$ of the mounting electrodes 23 enables joining to the circuit substrate 90 with the electronic component 100a, 100b in a stable position with the conductor 31 spread along the width of the insulating substrate 21. Accordingly, this enables the mounting stability of the electronic component 100a, 100b to be maintained.

In the electronic component 100a, 100b according to the present preferred embodiment, since the connection electrodes 22 include two of the adjacent portions 22e each adjacent to a respective one of the paired side surfaces 21c of the insulating substrate 21, the conductor 31 is able to be spread to the maximum extent of the width of the insulating substrate 21 while also causing fillets of the conductor 31 to form. As a result, joining onto the circuit substrate 90 is performed with the electronic component 100a, 100b in a stable position, and mounting stability for the electronic component 100a, 100b is preserved.

In the electronic component 100a, 100b according to the present preferred embodiment, in terms of the length of the insulating substrate 21, the maximum length $L_2$ of the connection electrodes 22 is greater than the maximum length $L_1$ of the mounting electrodes 23. Accordingly, this enables further surface area to be secured for the connection electrodes 22 where the conductor 31 wets over, and enables the mounting stability of the electronic component 100a, 100b to be maintained.

In the electronic component 100a, 100b according to the present preferred embodiment, the mounting electrodes 23 are, as seen in a plan view, separated from the end surface 21d of the insulating substrate 21. Accordingly, when the capacitor element 10a, 10b is mounted on the substrate terminal 20, a misalignment of position by the capacitor element 10a, 10b on the substrate terminal 20 is prevented, and a misalignment of position in which the capacitor element 10a, 10b rotates on the substrate terminal 20 is particularly prevented.

As described above, the electronic component 100a, 100b is contained in a carrier tape. When the carrier tape is paper, then when the electronic component 100a, 100b is contained in the carrier tape, and when the electronic component 100a, 100b is removed from the carrier tape, fuzz may be produced on the carrier tape due to burrs of the connection electrodes 22. When the capacitor element 10a, 10b is mounted on the substrate terminal 20, if fuzz is mixed into the solder, then the joining strength between the capacitor element 10a, 10b and the substrate terminal 20 decreases in some case. Also, when burrs of the connection electrodes 22 are caught on the fuzz, then the electronic component 100a, 100b may become irremovable from the carrier tape. These are also mounting defects for the electronic component 100a, 100b caused by the burrs of the connection electrode 22.

In the electronic component 100a, 100b according to the present preferred embodiment, since the burrs of the connection electrode 22 are prevented from occurring, the fuzz produced due to the burrs of the connection electrodes 22 is in turn reduced, which enables prevention of fuzz becoming mixed into the solder and of the burrs of the connection electrodes 22 becoming caught on the carrier tape.

As described above, in the electronic component 100a, 100b according to the present preferred embodiment, the formation of burrs on the electrodes of the substrate terminals 20 is prevented while mounting stability of the electronic component 100a, 100b is maintained.

Also, in the present preferred embodiment, electroplating is preferably performed on the wiring pattern. However, electroless plating may also be performed. Also, a foam peeling sheet that foams upon heating is used as the cutting support member. However, a foam peeling sheet that foams upon irradiation by ultraviolet rays may also be used.

Furthermore, the method for cutting the motherboard 200 is not limited to dicing, but may also be laser scribing or the like. When the motherboard 200 is cut by laser scribing, then the adjacent portion 22e of the connection electrode 22 does not cover the side surface 21c of the insulating substrate 21. Cutting using laser scribing enables the formation of burrs on the connection electrode 22 to be prevented.

Figure 18:
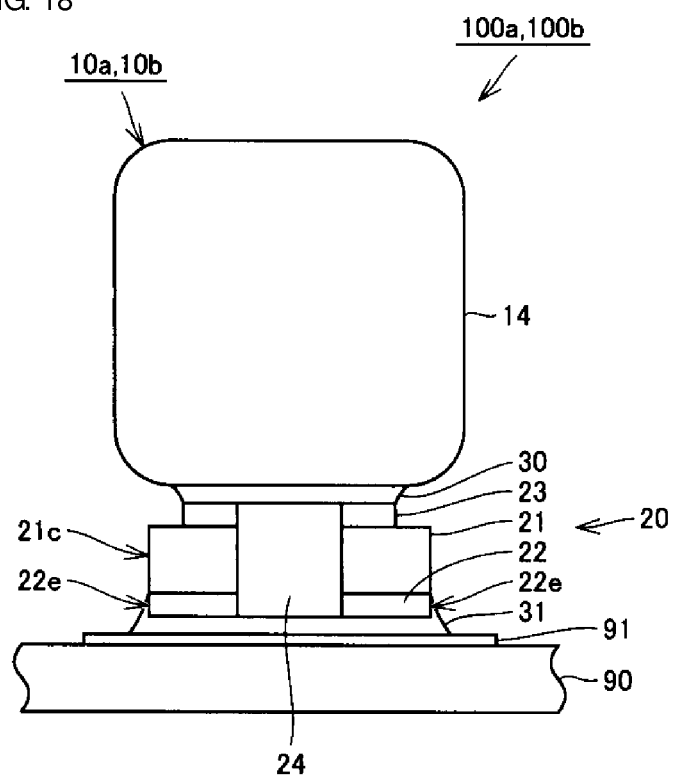
FIG. 18 is a diagram of the electronic component as mounted on the circuit substrate when a circumferential-surface neighboring portion of the connection electrodes does not cover a side surface of an insulating substrate.

FIG. 18 illustrates the electronic component as mounted on the circuit substrate when the adjacent portion of the connection electrode does not cover the side surface of the insulating substrate. FIG. 18 illustrates the electronic component seen from the same direction as FIG. 5.

As illustrated in FIG. 18, although the adjacent portion 22e of the connection electrode 22 does not cover the side surface 21c of the insulating substrate 21, the conductor 31 is able to spread to the maximum extent of the width of the insulating substrate 21 while also causing fillets of the conductor 31 to form. As a result, joining onto the circuit substrate 90 is performed with the electronic component 100a, 100b in a stable position, and mounting stability for the electronic component 100a, 100b is preserved.

All points described in the preferred embodiments of the present invention are intended as examples and should be construed as non-limiting. The scope of the present invention is indicated not by the above-given explanations but by the scope of the claims, and is intended to include all changes having equivalent significance to the patent claims and that are within this scope.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component, comprising:
   an electronic element including an external electrode on a surface thereof; and
   a substrate terminal on which the electronic element is mounted; wherein
   the substrate terminal has an external shape that is rectangular or substantially rectangular in a plan view;

the substrate terminal includes a first main surface, a second main surface that is opposite the first main surface, and a peripheral surface joining the first main surface and the second main surface;

the peripheral surface of the substrate terminal includes a pair of side surfaces at mutually opposing positions, and a pair of end surfaces at mutually opposing positions that respectively join the side surfaces;

the substrate terminal includes a mounting electrode that is provided on the second main surface and that is electrically connected to the external electrode of the electronic element, and a connection electrode that is provided on the first main surface;

a maximum width of the connection electrode is greater than a maximum width of the mounting electrode;

the connection electrode includes an adjacent portion disposed on the pair of side surfaces of the peripheral surface of the substrate terminal;

the mounting electrode does not include an adjacent portion disposed on the peripheral surface of the substrate terminal;

the substrate terminal includes a plurality of notches;

the mounting electrode is in contact with a portion of at least one of the plurality of notches; and the mounting electrode is not in contact with the peripheral surface of the substrate terminal except for the portion of the at least one of the plurality of notches.

2. The electronic component of claim 1, wherein the connection electrode is in contact with a portion of at least one of the plurality of notches; and the connection electrode is not in contact with the end surfaces of the substrate terminal except for the portion of the at least one of the plurality of notches that the connection electrode is contact with.

3. The electronic component of claim 1, wherein with respect to a direction parallel or substantially parallel to a direction of joining the side surfaces along the end surfaces, a maximum width of the substrate terminal is less than a maximum width of the electronic element.

4. The electronic component of claim 3, wherein with respect to a direction parallel or substantially parallel to a direction of joining the end surfaces along the side surfaces, a maximum length of the substrate terminal is less than a maximum length of the electronic element.

5. The electronic component of claim 4, wherein the substrate terminal is entirely covered by the electronic element in a plan view.

6. The electronic component of claim 1, wherein the mounting electrode is separated from the end surfaces in a plan view.

7. The electronic component of claim 1, wherein the electronic element is one of a capacitor element, an inductor element, a thermistor element, a piezoelectric element, and a semiconductor element.

8. The electronic component of claim 1, wherein the electronic element includes a multilayer body including a plurality of dielectric layers and a plurality of internal electrodes alternatingly stacked on each other in a stacking direction.

9. The electronic component of claim 8, wherein the stacking direction is perpendicular or substantially perpendicular to a length direction and a height direction of the electronic element.

10. The electronic component of claim 8, wherein the stacking direction is perpendicular or substantially perpendicular to a length direction and a width direction of the electronic element.

11. The electronic component of claim 1, wherein the electronic element includes external electrodes provided at both ends in a length direction of the electronic element.

12. The electronic component of claim 1, wherein a thickness of the substrate terminal is not less than about 0.05 mm and substantially no more than about 0.4 mm.

13. The electronic component of claim 1, wherein a minimum length of the substrate terminal is about 0.8 times or more a maximum length of the electronic element.

14. The electronic component of claim 1, wherein a minimum length of the substrate terminal is about 0.8 times or more a maximum width of the electronic element.

15. The electronic component of claim 1, wherein both end surfaces of the substrate terminal include at least one of the plurality of notches provided therein.

16. The electronic component of claim 15, wherein the electronic element covers a portion of each of the plurality of notches provided in the substrate terminal in a plan view.

17. The electronic component of claim 1, wherein a maximum thickness of the mounting electrode is less than a maximum thickness of the connection electrode.

18. The electronic component of claim 1, wherein a maximum length of the mounting electrode is less than a maximum length of the connection electrode.

* * * * *